United States Patent
Chen et al.

(10) Patent No.: US 10,937,872 B1
(45) Date of Patent: Mar. 2, 2021

(54) SEMICONDUCTOR STRUCTURES (71) Applicant: Vanguard International Semiconductor Corporation, Hsinchu (TW)

(72) Inventors: Li-Che Chen, Hsinchu (TW); Chien-Hsien Song, Kaohsiung (TW); Chih-Wei Lin, Jhubei (TW); Hung-Chih Tan, Kaohsiung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/534,114

(22) Filed: Aug. 7, 2019

(51) Int. Cl.
*H01L 29/40* (2006.01)
*H01L 29/78* (2006.01)
*H01L 29/66* (2006.01)
*H01L 29/10* (2006.01)

(52) U.S. Cl.
CPC ........ *H01L 29/402* (2013.01); *H01L 29/1083* (2013.01); *H01L 29/66681* (2013.01); *H01L 29/7823* (2013.01)

(58) Field of Classification Search
CPC ........ H01L 29/42372; H01L 29/42376; H01L 29/4238; H01L 29/402; H01L 29/1083
See application file for complete search history.

(56) References Cited

U.S. PATENT DOCUMENTS

| | | | | |
|---|---|---|---|---|
| 4,586,064 A | * | 4/1986 | Esser | H01L 29/402 257/340 |
| 4,716,446 A | * | 12/1987 | Esser | H01L 29/4916 257/336 |
| 5,237,193 A | * | 8/1993 | Williams | H01L 29/7835 257/336 |
| 5,411,901 A | * | 5/1995 | Grabowski | H01L 27/098 438/283 |
| 5,412,241 A | * | 5/1995 | Merchant | H01L 29/402 257/347 |
| 5,432,370 A | * | 7/1995 | Kitamura | H01L 29/063 257/339 |
| 5,514,608 A | * | 5/1996 | Williams | H01L 29/1079 438/286 |
| 5,918,137 A | * | 6/1999 | Ng | H01L 29/7816 438/454 |

(Continued)

FOREIGN PATENT DOCUMENTS

| | | | | |
|---|---|---|---|---|
| GB | 2150746 A | * | 7/1985 | ............ H01L 29/78 |
| WO | WO-2013123805 A1 | * | 8/2013 | ........... H01L 29/735 |

OTHER PUBLICATIONS

M. Ono et al., A 40 nm Gate Length n-MOSFET, IEEE Transactions on Electron Devices, Oct. 1995, vol. 42, No. 10, pp. 1822-1823 (Year: 1995).*

*Primary Examiner* — Victoria K. Hall
(74) *Attorney, Agent, or Firm* — Birch, Stewart, Kolasch & Birch, LLP (57) ABSTRACT

A semiconductor structure is provided. The semiconductor structure includes a substrate, a gate disposed on the substrate, a source disposed in the substrate and located on one side of the gate, a drain disposed in the substrate and located on another side of the gate, and a gate extending portion disposed on the substrate and located between the gate and the drain. The doping type of the gate is the opposite of that of the gate extending portion.

10 Claims, 7 Drawing Sheets

(56) References Cited

U.S. PATENT DOCUMENTS

| | | | | |
|---|---|---|---|---|
| 6,064,088 A * | 5/2000 | D'Anna | H01L 29/0692 | 257/341 |
| 6,215,152 B1 * | 4/2001 | Hebert | H01L 21/2815 | 257/340 |
| 6,348,716 B1 * | 2/2002 | Yun | H01L 27/0727 | 257/328 |
| 6,436,749 B1 * | 8/2002 | Tonti | H01L 21/82384 | 257/E21.637 |
| 6,492,678 B1 * | 12/2002 | Hebert | H01L 29/402 | 257/138 |
| 6,677,642 B2 * | 1/2004 | Peake | H01L 29/402 | 257/335 |
| 7,148,540 B2 * | 12/2006 | Shibib | H01L 29/7801 | 257/336 |
| 7,608,513 B2 * | 10/2009 | Yang | H01L 29/7835 | 438/286 |
| 8,853,022 B2 * | 10/2014 | Zhang | H01L 29/7835 | 438/197 |
| 8,946,851 B1 * | 2/2015 | McGregor | H01L 29/0634 | 257/492 |
| 8,963,241 B1 * | 2/2015 | Khemka | H01L 29/402 | 257/341 |
| 8,969,958 B1 * | 3/2015 | Khemka | H01L 29/401 | 257/341 |
| 8,987,818 B1 * | 3/2015 | McGregor | H01L 29/0653 | 257/341 |
| 9,142,625 B2 * | 9/2015 | Heringa | H01L 29/7835 | |
| 9,343,572 B1 * | 5/2016 | Lao | H01L 29/66681 | |
| 9,461,133 B1 * | 10/2016 | Hsiao | H01L 29/66704 | |
| 9,553,187 B2 * | 1/2017 | Chen | H01L 21/28105 | |
| 9,698,260 B1 * | 7/2017 | Zhang | H01L 29/7825 | |
| 9,793,372 B1 * | 10/2017 | Smith | H01L 21/3085 | |
| 10,418,480 B2 * | 9/2019 | Hu | H01L 21/28518 | |
| 10,833,164 B2 * | 11/2020 | Xia | H01L 29/407 | |
| 10,861,946 B1 * | 12/2020 | Ho | H01L 29/4966 | |
| 2002/0137318 A1 * | 9/2002 | Peake | H01L 29/66681 | 438/585 |
| 2002/0185679 A1 * | 12/2002 | Baliga | H01L 29/872 | 257/329 |
| 2005/0035410 A1 * | 2/2005 | Yeo | H01L 21/84 | 257/355 |
| 2005/0040493 A1 * | 2/2005 | Yeo | H01L 21/84 | 257/536 |
| 2006/0057793 A1 * | 3/2006 | Hatori | H01L 21/82342 | 438/197 |
| 2007/0158705 A1 * | 7/2007 | Takayanagi | H01L 21/2807 | 257/288 |
| 2008/0179670 A1 * | 7/2008 | Willmeroth | H01L 29/407 | 257/340 |
| 2009/0273036 A1 * | 11/2009 | Horstmann | H01L 21/82387 | 257/369 |
| 2012/0175679 A1 * | 7/2012 | Marino | H01L 29/407 | 257/194 |
| 2013/0105887 A1 * | 5/2013 | Zuniga | H01L 29/7835 | 257/330 |
| 2014/0353759 A1 * | 12/2014 | Ellis-Monaghan | H01L 27/092 | 257/369 |
| 2014/0361342 A1 * | 12/2014 | Sriram | H01L 29/402 | 257/194 |
| 2015/0060875 A1 * | 3/2015 | Kume | H01L 29/2003 | 257/76 |
| 2015/0061008 A1 * | 3/2015 | McGregor | H01L 29/7835 | 257/337 |
| 2015/0357466 A1 * | 12/2015 | Kumar | H01L 29/0634 | 257/341 |
| 2016/0172489 A1 * | 6/2016 | Chen | H01L 27/0251 | 257/343 |
| 2017/0125252 A1 * | 5/2017 | Strachan | H01L 29/7816 | |
| 2017/0346476 A1 * | 11/2017 | Xia | H01L 29/42368 | |
| 2018/0261676 A1 * | 9/2018 | Sonsky | H01L 29/42368 | |
| 2018/0286860 A1 * | 10/2018 | Giles | H01L 29/7816 | |
| 2019/0371902 A1 * | 12/2019 | Castro | H01L 29/7831 | |
| 2019/0386134 A1 * | 12/2019 | Kim | H01L 29/1045 | |

\* cited by examiner

SEMICONDUCTOR STRUCTURES

TECHNICAL FIELD

The technical field relates to a semiconductor structure capable of reducing drain-to-gate capacitance.

BACKGROUND

In many semiconductor structures, a field plate structure disposed between the gate and the drain is often used as an important component for dispersing the electric field strength of the drain region (the drift region) to avoid damage of components caused by excessive concentration of the electric field near the drain region (the drift region). However, when the field plate structure is electrically connected to its adjacent gate, the field plate structure simultaneously contributes a considerable degree of the drain-to-gate capacitance.

In general, with high-speed switching components that are expected to achieve high-performance electric power conversion, it is necessary to minimize power loss during operation to maintain high-speed conversion between components. However, when the switch is turned on and there is a large current flowing, if the above-mentioned drain-to-gate capacitance exists in the transistor adjacent to the phase, an unwanted current will flow through this transistor due to the coupling effect, resulting in power loss of the switching component.

At present, there are several ways to reduce the drain-to-gate capacitance, such as electrically connecting the field plate structure and the source, or increasing the thickness of the oxide layer underneath the field plate or the gate. Alternatively, a dopant having an opposite doping type to the drain region (the drift region) is implanted on the surface of the substrate underneath the gate. However, the various methods described above still have many disadvantages, such as an increase in resistance.

Therefore, development of a semiconductor structure capable of dispersing the electric field strength of a drain region (a drift region) and reducing the drain-to-gate capacitance is desirable.

SUMMARY

In accordance with one embodiment of the invention, a semiconductor structure is provided. The semiconductor structure includes a substrate, a gate disposed on the substrate, a source disposed in the substrate and located on one side of the gate, a drain disposed in the substrate and located on another side of the gate, and a gate extending portion disposed on the substrate and located between the gate and the drain. The doping type of the gate is the opposite of that of the gate extending portion.

In some embodiments, the substrate is a P-type substrate or an N-type substrate. In some embodiments, when the substrate is a P-type substrate, the doping type of the gate is N type, the doping type of the source is N type, the doping type of the drain is N type, and the doping type of the gate extending portion is P type. In some embodiments, when the substrate is an N-type substrate, the doping type of the gate is P type, the doping type of the source is P type, the doping type of the drain is P type, and the doping type of the gate extending portion is N type. In some embodiments, the gate and the gate extending portion include polysilicon doped with P-type dopants or polysilicon doped with N-type dopants.

In some embodiments, the gate is substantially in contact with the gate extending portion. In some embodiments, the gate is substantially separated from the gate extending portion.

In some embodiments, when the gate is substantially in contact with the gate extending portion, the semiconductor structure further includes a metal field plate disposed on the substrate and located between the gate extending portion and the drain. In some embodiments, the semiconductor structure further includes an oxide layer disposed on the substrate and underneath the metal field plate. In some embodiments, the metal field plate is electrically connected with the gate and the gate extending portion. In some embodiments, the metal field plate is electrically connected with the source. In some embodiments, the width ratio of the gate extending portion and the gate is in a range from about 0.3 to about 1.2. In some embodiments, the sum of the width of the gate extending portion and the width of the gate is a fixed value.

In some embodiments, when the gate is substantially separated from the gate extending portion, the gate is electrically connected with the gate extending portion. In some embodiments, the gate extending portion is electrically connected with the source.

In the present invention, two regions with opposite doping types (for example, the region adjacent to the drain is P-type doped (defined as the gate extending portion), and the region away from the drain is N-type doped (defined as the gate)) are formed in the polysilicon gate of a MOS transistor using implantation processes. Due to the effect of capacitor series connection, the drain-to-gate capacitance is reduced. As the ratio of the width of the gate extending portion and the width of the gate increases, the drain-to-gate capacitance decreases more obviously. At this time, the gate extending portion has the function of field plate, which can effectively disperse the electric field strength of the drain region (the drift region) and prevent the component from being damaged in a high-voltage operation environment. In addition, the two regions having opposite doping types can be fabricated into two separated structures. On the one hand, the gate extending portion can have the function of field plate, and on the other hand, the effect of reducing the drain-to-gate capacitance can be achieved. The cost of the present invention is low, and it is easily fabricated without changing the existing MOS process specifications. Due to the drop in the drain-to-gate capacitance, undesired current flow caused by the coupling effect of the transistor is avoided. The specific semiconductor structure design of the present invention can effectively reduce the power loss of the switching components, greatly improving the switching frequency and achieving high-efficiency electric power conversion.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
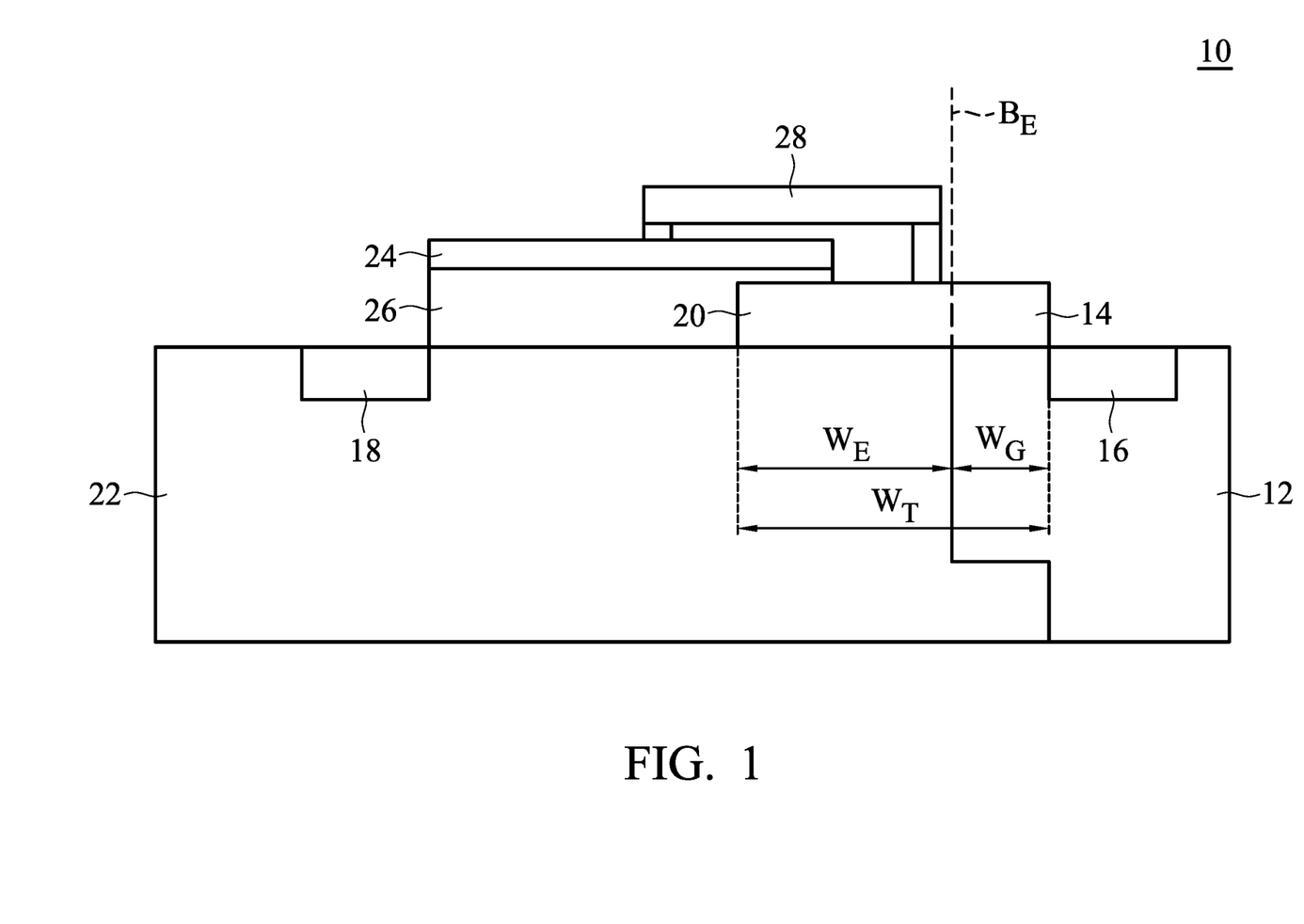
FIG. 1 is a cross-sectional view of a semiconductor structure in accordance with one embodiment of the invention.

Referring to FIG. 1, in accordance with one embodiment of the invention, a semiconductor structure 10 is provided. FIG. 1 is a cross-sectional view of the semiconductor structure 10.

As shown in FIG. 1, the semiconductor structure 10 includes a substrate 12, a gate 14, a source 16, a drain 18, a gate extending portion 20 and a drain drift region 22. The gate 14 is disposed on the substrate 12. The source 16 is disposed in the substrate 12 and located on one side of the gate 14. The drain 18 is disposed in the substrate 12 and located on another side of the gate 14. The gate extending portion 20 is disposed on the substrate 12 and located between the gate 14 and the drain 18. The drain drift region 22 is formed in the substrate 12 and surrounds the drain 18. Specifically, the doping type of the gate 14 is the opposite of that of the gate extending portion 20. For example, when the doping type of the gate 14 is N type, the doping type of the gate extending portion 20 is P type, or when the doping type of the gate 14 is P type, the doping type of the gate extending portion 20 is N type. Since the doping type of the gate 14 is the opposite of the doping type of the gate extending portion 20, a depletion region (not shown) is naturally formed between the gate 14 and the gate extending portion 20.

In some embodiments, the substrate 12 is a P-type semiconductor substrate or an N-type semiconductor substrate. In some embodiments, when the substrate 12 is a P-type semiconductor substrate, the doping type of the gate 14 is N type, the doping type of the source 16 is N type, the doping type of the drain 18 is N type, and the doping type of the gate extending portion 20 is P type. In some embodiments, when the substrate 12 is an N-type semiconductor substrate, the doping type of the gate 14 is P type, the doping type of the source 16 is P type, the doping type of the drain 18 is P type, and the doping type of the gate extending portion 20 is N type. In some embodiments, the gate 14 and the gate extending portion 20 include polysilicon doped with P-type dopants or polysilicon doped with N-type dopants.

In FIG. 1, the gate 14 is substantially in contact with the gate extending portion 20. For example, the gate 14 is substantially in contact laterally with the gate extending portion 20 (i.e. the sidewall of the gate 14 is substantially in contact with the sidewall of the gate extending portion 20). In some embodiments, the ratio of the width "$W_E$" of the gate extending portion 20 and the width "$W_G$" of the gate 14 is in a range from about 0.3 to about 1.2. For example, the width "$W_E$" of the gate extending portion 20 is about 0.15 μm, and the width "$W_G$" of the gate 14 is about 0.5 μm (the ratio thereof is about 0.3), or the width "$W_E$" of the gate extending portion 20 is about 0.25 μm, and the width "$W_G$" of the gate 14 is about 0.4 μm (the ratio thereof is about 0.625), or the width "$W_E$" of the gate extending portion 20 is about 0.35 μm, and the width "$W_G$" of the gate 14 is about 0.3 μm (the ratio thereof is about 1.17). In some embodiments, the ratio of the width "$W_E$" of the gate extending portion 20 and the width "$W_G$" of the gate 14 may also be other suitable ranges, and is not limited thereto. In some embodiments, the boundary "$B_E$" of the gate extending portion 20 and the gate 14 is not more than the range of the drain drift region 22 (i.e. the gate extending portion 20 only overlaps the drain drift region 22 in the substrate 12). In some embodiments, in the semiconductor structure 10, the sum "$W_T$" of the width "$W_E$" of the gate extending portion 20 and the width "$W_G$" of the gate 14 is a fixed value. For example, when the ratio of the width "$W_E$" of the gate extending portion 20 and the width "$W_G$" of the gate 14 is in a range from about 0.3 to about 1.2, the sum "$W_T$" of the width "$W_E$" of the gate extending portion 20 and the width "$W_G$" of the gate 14 is about 0.65 μm (For example, the width "$W_E$" of the gate extending portion 20 is about 0.15 μm, and the width "$W_G$" of the gate 14 is about 0.5 μm, or the width "$W_E$" of the gate extending portion 20 is about 0.25 μm, and the width "$W_G$" of the gate 14 is about 0.4 μm, or the width "$W_E$" of the gate extending portion 20 is about 0.35 μm, and the width "$W_G$" of the gate 14 is about 0.3 μm). In some embodiments, according to different product requirements, the sum "$W_T$" of the width "$W_E$" of the gate extending portion 20 and the width "$W_G$" of the gate 14 may also include other suitable sizes, and is not limited thereto.

In FIG. 1, the semiconductor structure 10 further includes a metal field plate 24 disposed on the substrate 12 and located between the gate extending portion 20 and the drain 18. As shown in FIG. 1, the semiconductor structure 10 further includes an oxide layer 26 disposed on the substrate 12 and underneath the metal field plate 24. In FIG. 1, the metal field plate 24 and the underlying oxide layer 26 cover a portion of the gate extending portion 20. The metal field plate 24 is electrically connected with the gate 14 and the gate extending portion 20 by the metal layer 28. Since the metal field plate 24 is electrically connected with the gate extending portion 20, in the present embodiment, the gate extending portion 20 can also be regarded as another part of the metal field plate. In some embodiments, the fabrication method of the gate 14 and the gate extending portion 20 which are substantially in contact with each other is shown. For example, first, a patterned polysilicon layer is formed on the substrate 12. Next, an N-type implantation process is performed on a region of the patterned polysilicon layer in which the gate 14 is predetermined to be formed, and a P-type implantation process is performed on a region of the patterned polysilicon layer in which the gate extending portion 20 is predetermined to be formed. Optionally, a P-type implantation process is performed on a region of the patterned polysilicon layer in which the gate 14 is predetermined to be formed, and an N-type implantation process is performed on a region of the patterned polysilicon layer in which the gate extending portion 20 is predetermined to be formed. So far, the fabrication of the gate 14 and the gate extending portion 20 having opposite doping types and substantially in contact with each other is completed.

Figure 2:
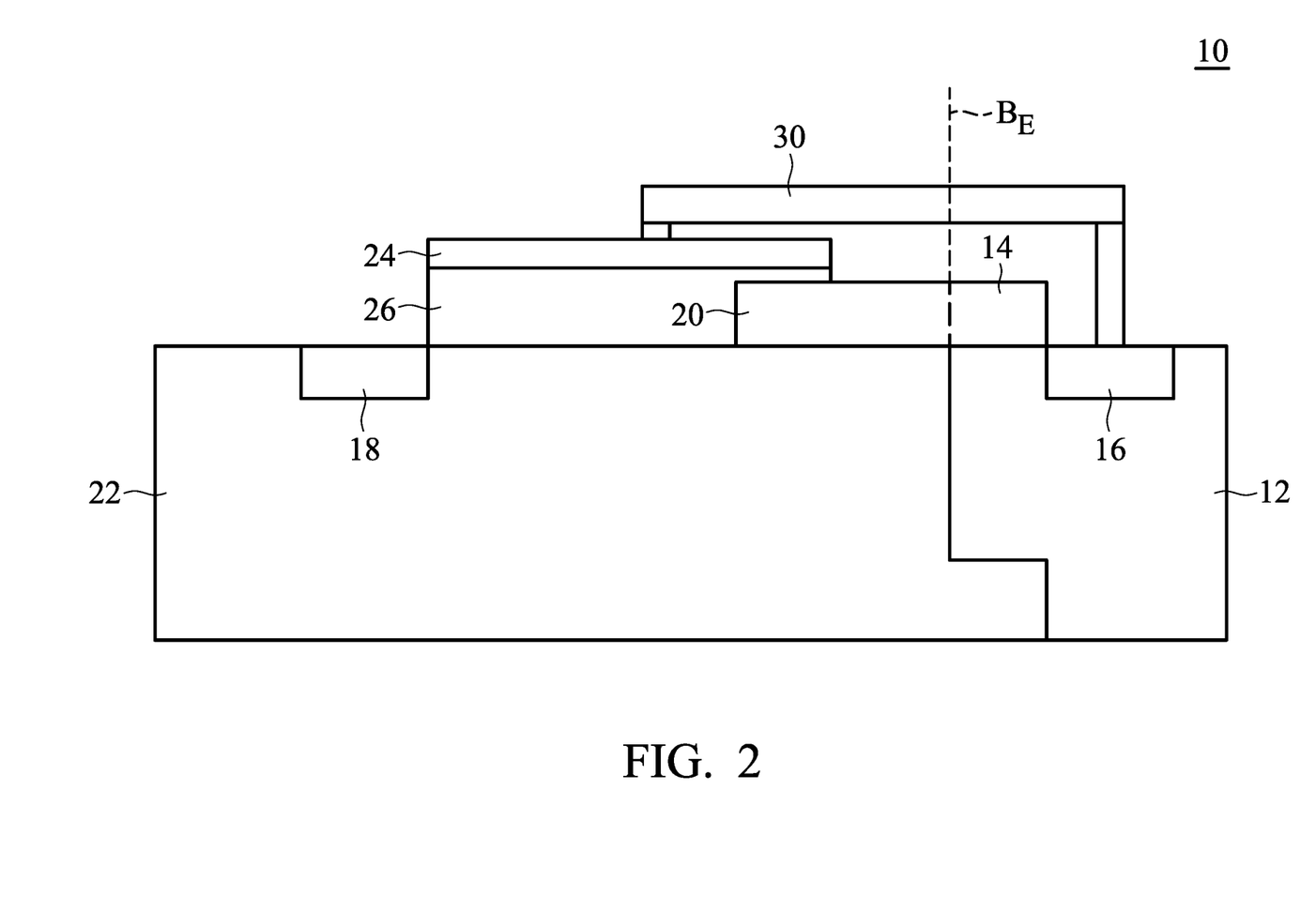
FIG. 2 is a cross-sectional view of a semiconductor structure in accordance with one embodiment of the invention.

Referring to FIG. 2, in accordance with one embodiment of the invention, a semiconductor structure 10 is provided. FIG. 2 is a cross-sectional view of the semiconductor structure 10.

As shown in FIG. 2, the semiconductor structure 10 includes a substrate 12, a gate 14, a source 16, a drain 18, a gate extending portion 20 and a drain drift region 22. The gate 14 is disposed on the substrate 12. The source 16 is disposed in the substrate 12 and located on one side of the gate 14. The drain 18 is disposed in the substrate 12 and located on another side of the gate 14. The gate extending portion 20 is disposed on the substrate 12 and located between the gate 14 and the drain 18. The drain drift region 22 is formed in the substrate 12 and surrounds the drain 18. Specifically, the doping type of the gate 14 is the opposite of that of the gate extending portion 20. For example, when the doping type of the gate 14 is N type, the doping type of the gate extending portion 20 is P type, or when the doping type of the gate 14 is P type, the doping type of the gate extending portion 20 is N type. Since the doping type of the gate 14 is the opposite of the doping type of the gate extending portion 20, a depletion region (not shown) is naturally formed between the gate 14 and the gate extending portion 20.

In some embodiments, the substrate 12 is a P-type semiconductor substrate or an N-type semiconductor substrate. In some embodiments, when the substrate 12 is a P-type semiconductor substrate, the doping type of the gate 14 is N type, the doping type of the source 16 is N type, the doping type of the drain 18 is N type, and the doping type of the gate extending portion 20 is P type. In some embodiments, when the substrate 12 is an N-type semiconductor substrate, the doping type of the gate 14 is P type, the doping type of the source 16 is P type, the doping type of the drain 18 is P type, and the doping type of the gate extending portion 20 is N type. In some embodiments, the gate 14 and the gate extending portion 20 include polysilicon doped with P-type dopants or polysilicon doped with N-type dopants.

In FIG. 2, the gate 14 is substantially in contact with the gate extending portion 20. For example, the gate 14 is substantially in contact laterally with the gate extending portion 20 (i.e. the sidewall of the gate 14 is substantially in contact with the sidewall of the gate extending portion 20). In some embodiments, the ratio of the width "$W_E$" of the gate extending portion 20 and the width "$W_G$" of the gate 14 is in a range from about 0.3 to about 1.2. For example, the width "$W_E$" of the gate extending portion 20 is about 0.15 µm, and the width "$W_G$" of the gate 14 is about 0.5 µm (the ratio thereof is about 0.3), or the width "$W_E$" of the gate extending portion 20 is about 0.25 µm, and the width "$W_G$" of the gate 14 is about 0.4 µm (the ratio thereof is about 0.625), or the width "$W_E$" of the gate extending portion 20 is about 0.35 µm, and the width "$W_G$" of the gate 14 is about 0.3 µm (the ratio thereof is about 1.17). In some embodiments, the ratio of the width "$W_E$" of the gate extending portion 20 and the width "$W_G$" of the gate 14 may also be other suitable ranges, and is not limited thereto. In some embodiments, the boundary "$B_E$" of the gate extending portion 20 and the gate 14 is not more than the range of the drain drift region 22 (i.e. the gate extending portion 20 only overlaps the drain drift region 22 in the substrate 12). In some embodiments, in the semiconductor structure 10, the sum "$W_T$" of the width "$W_E$" of the gate extending portion 20 and the width "$W_G$" of the gate 14 is a fixed value. For example, when the ratio of the width "$W_E$" of the gate extending portion 20 and the width "$W_G$" of the gate 14 is in a range from about 0.3 to about 1.2, the sum "$W_T$" of the width "$W_E$" of the gate extending portion 20 and the width "$W_G$" of the gate 14 is about 0.65 µm (For example, the width "$W_E$" of the gate extending portion 20 is about 0.15 µm, and the width "$W_G$" of the gate 14 is about 0.5 µm, or the width "$W_E$" of the gate extending portion 20 is about 0.25 µm, and the width "$W_G$" of the gate 14 is about 0.4 µm, or the width "$W_E$" of the gate extending portion 20 is about 0.35 µm, and the width "$W_G$" of the gate 14 is about 0.3 µm). In some embodiments, according to different product requirements, the sum "$W_T$" of the width "$W_E$" of the gate extending portion 20 and the width "$W_G$" of the gate 14 may also include other suitable sizes, and is not limited thereto.

In FIG. 2, the semiconductor structure 10 further includes a metal field plate 24 disposed on the substrate 12 and located between the gate extending portion 20 and the drain 18. As shown in FIG. 2, the semiconductor structure 10 further includes an oxide layer 26 disposed on the substrate 12 and underneath the metal field plate 24. In FIG. 2, the metal field plate 24 and the underlying oxide layer 26 cover a portion of the gate extending portion 20. The metal field plate 24 is electrically connected with the source 16 by the metal layer 30. In some embodiments, the fabrication method of the gate 14 and the gate extending portion 20 which are substantially in contact with each other is shown. For example, first, a patterned polysilicon layer is formed on the substrate 12. Next, an N-type implantation process is performed on a region of the patterned polysilicon layer in which the gate 14 is predetermined to be formed, and a P-type implantation process is performed on a region of the patterned polysilicon layer in which the gate extending portion 20 is predetermined to be formed. Optionally, a P-type implantation process is performed on a region of the patterned polysilicon layer in which the gate 14 is predetermined to be formed, and an N-type implantation process is performed on a region of the patterned polysilicon layer in which the gate extending portion 20 is predetermined to be formed. So far, the fabrication of the gate 14 and the gate extending portion 20 having opposite doping types and substantially in contact with each other is completed.

Figure 3:
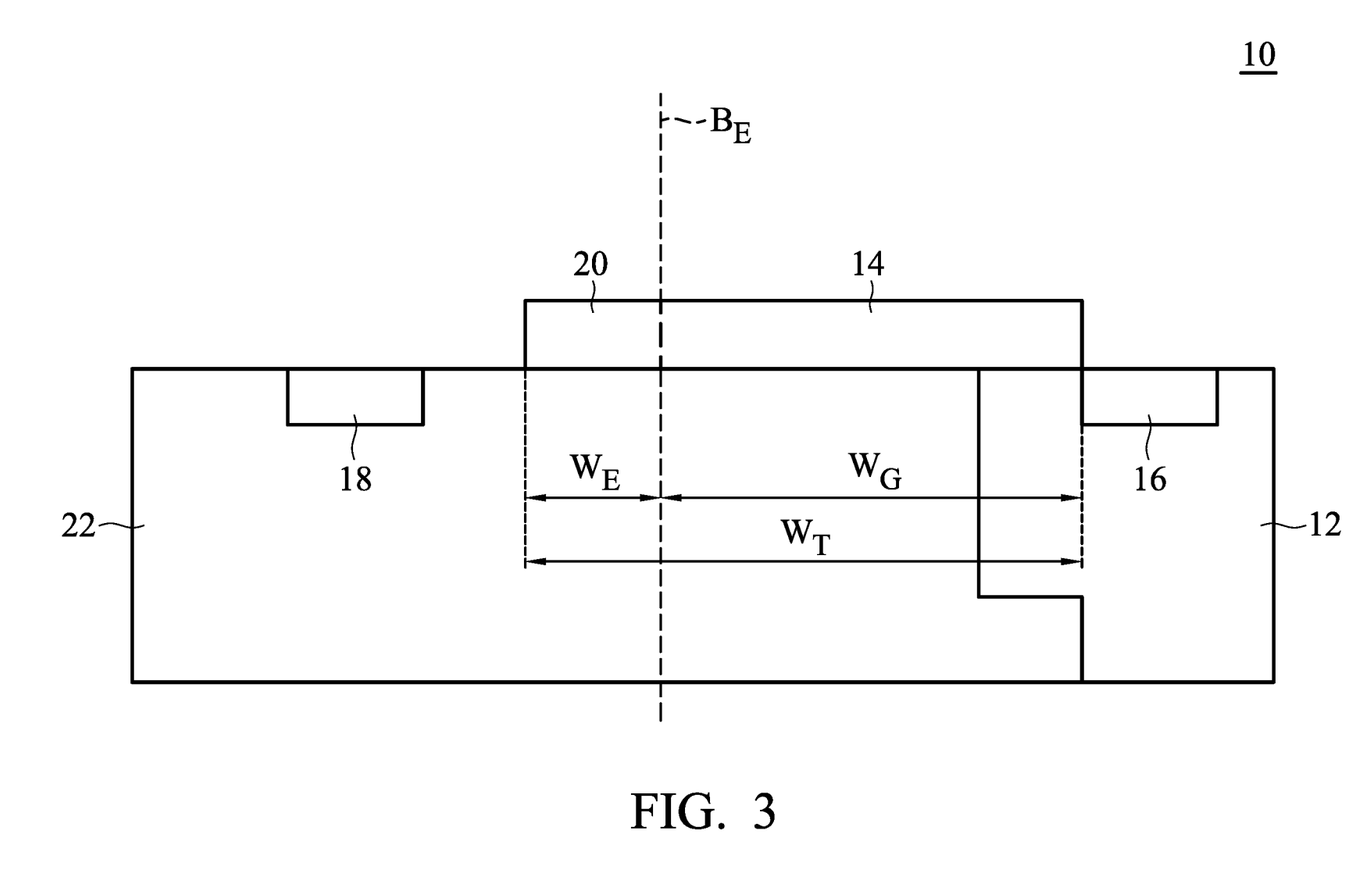
FIG. 3 is a cross-sectional view of a semiconductor structure in accordance with one embodiment of the invention.

Referring to FIG. 3, in accordance with one embodiment of the invention, a semiconductor structure 10 is provided. FIG. 3 is a cross-sectional view of the semiconductor structure 10.

As shown in FIG. 3, the semiconductor structure 10 includes a substrate 12, a gate 14, a source 16, a drain 18, a gate extending portion 20 and a drain drift region 22. The gate 14 is disposed on the substrate 12. The source 16 is disposed in the substrate 12 and located on one side of the gate 14. The drain 18 is disposed in the substrate 12 and located on another side of the gate 14. The gate extending portion 20 is disposed on the substrate 12 and located between the gate 14 and the drain 18. The drain drift region 22 is formed in the substrate 12 and surrounds the drain 18. Specifically, the doping type of the gate 14 is the opposite of that of the gate extending portion 20. For example, when the doping type of the gate 14 is N type, the doping type of the gate extending portion 20 is P type, or when the doping type of the gate 14 is P type, the doping type of the gate extending portion 20 is N type. Since the doping type of the gate 14 is the opposite of the doping type of the gate extending portion 20, a depletion region (not shown) is naturally formed between the gate 14 and the gate extending portion 20.

In some embodiments, the substrate 12 is a P-type semiconductor substrate or an N-type semiconductor substrate. In some embodiments, when the substrate 12 is a P-type semiconductor substrate, the doping type of the gate 14 is N type, the doping type of the source 16 is N type, the doping type of the drain 18 is N type, and the doping type of the gate extending portion 20 is P type. In some embodiments, when the substrate 12 is an N-type semiconductor substrate, the doping type of the gate 14 is P type, the doping type of the source 16 is P type, the doping type of the drain 18 is P type, and the doping type of the gate extending portion 20 is N type. In some embodiments, the gate 14 and the gate extending portion 20 include polysilicon doped with P-type dopants or polysilicon doped with N-type dopants.

In FIG. 3, the gate 14 is substantially in contact with the gate extending portion 20. For example, the gate 14 is substantially in contact laterally with the gate extending portion 20 (i.e. the sidewall of the gate 14 is substantially in contact with the sidewall of the gate extending portion 20). In the present embodiment, the ratio of the width "$W_E$" of the gate extending portion 20 (P-type doping) and the width "$W_G$" of the gate 14 (N-type doping) is about 0.3. In this situation, the width "$W_E$" of the gate extending portion 20 is about 0.15 μm, and the width "$W_G$" of the gate 14 is about 0.5 μm. In some embodiments, the ratio of the width "$W_E$" of the gate extending portion 20 and the width "$W_G$" of the gate 14 may also be other suitable ranges, and is not limited thereto. In some embodiments, the boundary "$B_E$" of the gate extending portion 20 and the gate 14 is not more than the range of the drain drift region 22 (i.e. the gate extending portion 20 only overlaps the drain drift region 22 in the substrate 12). In some embodiments, in the semiconductor structure 10, the sum "$W_T$" of the width "$W_E$" of the gate extending portion 20 and the width "$W_G$" of the gate 14 is a fixed value. In the present embodiment, when the ratio of the width "$W_E$" of the gate extending portion 20 and the width "$W_G$" of the gate 14 is about 0.3, the sum "$W_T$" of the width "$W_E$" of the gate extending portion 20 and the width "$W_G$" of the gate 14 is about 0.65 μm (that is, the width "$W_E$" of the gate extending portion 20 is about 0.15 μm, and the width "$W_G$" of the gate 14 is about 0.5 μm). In some embodiments, according to different product requirements, the sum "$W_T$" of the width "$W_E$" of the gate extending portion 20 and the width "$W_G$" of the gate 14 may also include other suitable sizes, and is not limited thereto. In the present embodiment, the gate extending portion 20 can be considered a metal field plate. The component operation is performed with the semiconductor structure of the present embodiment. Various operating conditions (for example, threshold voltage (Vth), linear-region drain current (Idlin), saturation-region drain current (Idsat), static breakdown voltage (BVoff)), and the drain-to-gate capacitance (Cgd) are shown in Table 1.

In some embodiments, the fabrication method of the gate 14 and the gate extending portion 20 which are substantially in contact with each other is shown. For example, first, a patterned polysilicon layer is formed on the substrate 12. Next, an N-type implantation process is performed on a region (the width thereof is about 0.5 μm) of the patterned polysilicon layer in which the gate 14 is predetermined to be formed, and a P-type implantation process is performed on a region (the width thereof is about 0.15 μm) of the patterned polysilicon layer in which the gate extending portion 20 is predetermined to be formed (as the present embodiment). Optionally, a P-type implantation process is performed on a region (the width thereof is about 0.5 μm) of the patterned polysilicon layer in which the gate 14 is predetermined to be formed, and an N-type implantation process is performed on a region (the width thereof is about 0.15 μm) of the patterned polysilicon layer in which the gate extending portion 20 is predetermined to be formed. So far, the fabrication of the gate 14 and the gate extending portion 20 having opposite doping types and substantially in contact with each other is completed.

Figure 4:
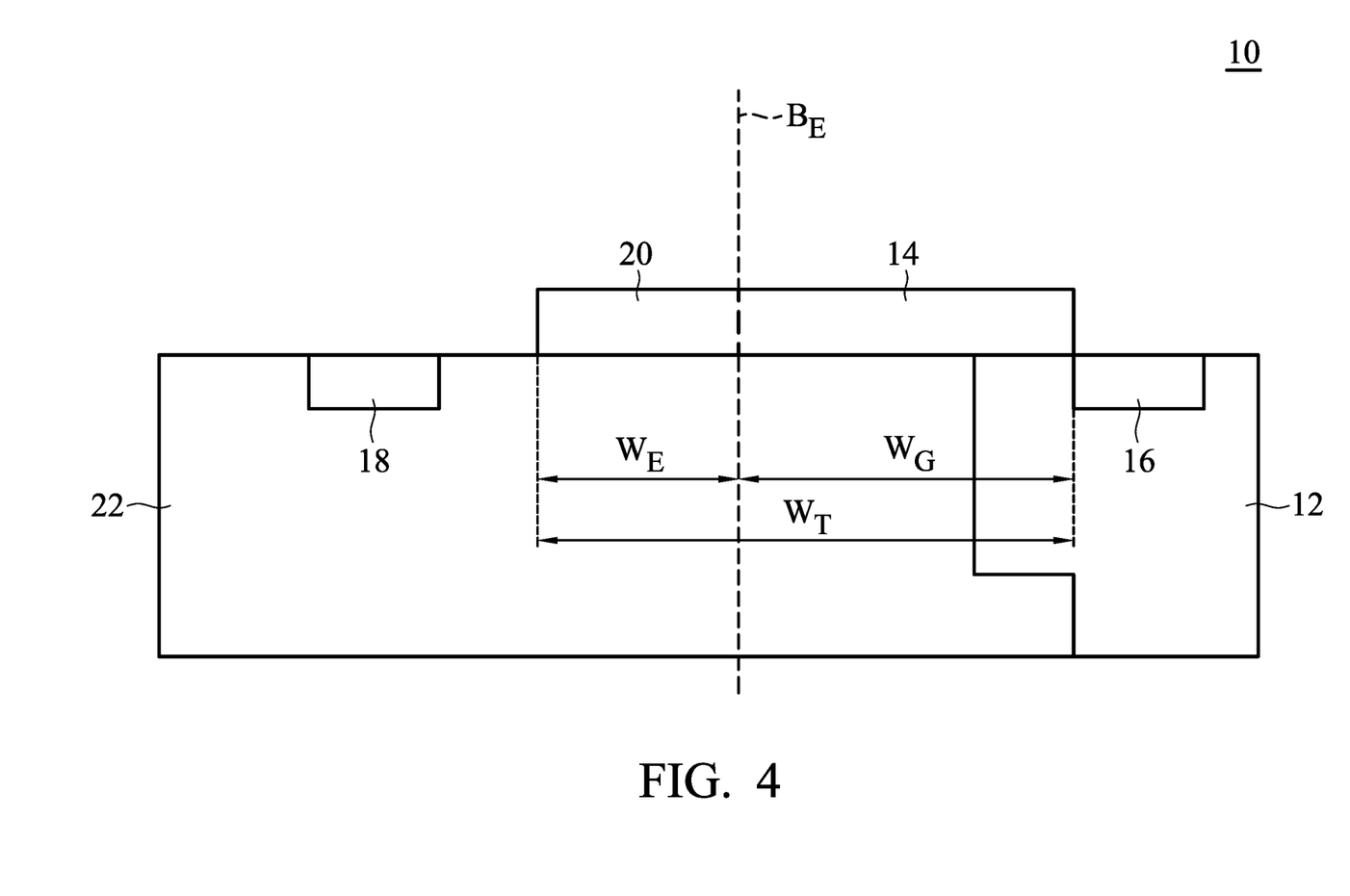
FIG. 4 is a cross-sectional view of a semiconductor structure in accordance with one embodiment of the invention.

Referring to FIG. 4, in accordance with one embodiment of the invention, a semiconductor structure 10 is provided. FIG. 4 is a cross-sectional view of the semiconductor structure 10.

As shown in FIG. 4, the semiconductor structure 10 includes a substrate 12, a gate 14, a source 16, a drain 18, a gate extending portion 20 and a drain drift region 22. The gate 14 is disposed on the substrate 12. The source 16 is disposed in the substrate 12 and located on one side of the gate 14. The drain 18 is disposed in the substrate 12 and located on another side of the gate 14. The gate extending portion 20 is disposed on the substrate 12 and located between the gate 14 and the drain 18. The drain drift region 22 is formed in the substrate 12 and surrounds the drain 18. Specifically, the doping type of the gate 14 is the opposite of that of the gate extending portion 20. For example, when the doping type of the gate 14 is N type, the doping type of the gate extending portion 20 is P type, or when the doping type of the gate 14 is P type, the doping type of the gate extending portion 20 is N type. Since the doping type of the gate 14 is the opposite of the doping type of the gate extending portion 20, a depletion region (not shown) is naturally formed between the gate 14 and the gate extending portion 20.

In some embodiments, the substrate 12 is a P-type semiconductor substrate or an N-type semiconductor substrate. In some embodiments, when the substrate 12 is a P-type semiconductor substrate, the doping type of the gate 14 is N type, the doping type of the source 16 is N type, the doping type of the drain 18 is N type, and the doping type of the gate extending portion 20 is P type. In some embodiments, when the substrate 12 is an N-type semiconductor substrate, the doping type of the gate 14 is P type, the doping type of the source 16 is P type, the doping type of the drain 18 is P type, and the doping type of the gate extending portion 20 is N type. In some embodiments, the gate 14 and the gate extending portion 20 include polysilicon doped with P-type dopants or polysilicon doped with N-type dopants.

In FIG. 4, the gate 14 is substantially in contact laterally with the gate extending portion 20. For example, the gate 14 is substantially in contact with the gate extending portion 20 (i.e. the sidewall of the gate 14 is substantially in contact with the sidewall of the gate extending portion 20). In the present embodiment, the ratio of the width "$W_E$" of the gate extending portion 20 (P-type doping) and the width "$W_G$" of the gate 14 (N-type doping) is about 0.625. In this situation, the width "$W_E$" of the gate extending portion 20 is about 0.25 μm, and the width "$W_G$" of the gate 14 is about 0.4 μm. In some embodiments, the ratio of the width "$W_E$" of the gate extending portion 20 and the width "$W_G$" of the gate 14 may also be other suitable ranges, and is not limited thereto. In some embodiments, the boundary "$B_E$" of the gate extending portion 20 and the gate 14 is not more than the range of the drain drift region 22 (i.e. the gate extending portion 20 only overlaps the drain drift region 22 in the substrate 12). In some embodiments, in the semiconductor structure 10, the sum "$W_T$" of the width "$W_E$" of the gate extending portion 20 and the width "$W_G$" of the gate 14 is a fixed value. In the present embodiment, when the ratio of the width "$W_E$" of the gate extending portion 20 and the width "$W_G$" of the gate 14 is about 0.625, the sum "$W_T$" of the width "$W_E$" of the gate extending portion 20 and the width "$W_G$" of the gate 14 is about 0.65 μm (that is, the width "$W_E$" of the gate extending portion 20 is about 0.25 μm, and the width "$W_G$" of the gate 14 is about 0.4 μm). In some embodiments, according to different product requirements, the sum "$W_T$" of the width "$W_E$" of the gate extending portion 20 and the width "$W_G$" of the gate 14 may also include other suitable sizes, and is not limited thereto. In the present embodiment, the gate extending portion 20 can be considered a metal field plate. The component operation is performed with the semiconductor structure of the present embodiment. Various operating conditions (for example, threshold voltage (Vth), linear-region drain current (Idlin), saturation-region drain current (Idsat), static breakdown voltage (BVoff)), and the drain-to-gate capacitance (Cgd) are shown in Table 1.

In some embodiments, the fabrication method of the gate 14 and the gate extending portion 20 which are substantially in contact with each other is shown. For example, first, a patterned polysilicon layer is formed on the substrate 12. Next, an N-type implantation process is performed on a region (the width thereof is about 0.4 µm) of the patterned polysilicon layer in which the gate 14 is predetermined to be formed, and a P-type implantation process is performed on a region (the width thereof is about 0.25 µm) of the patterned polysilicon layer in which the gate extending portion 20 is predetermined to be formed (as the present embodiment). Optionally, a P-type implantation process is performed on a region (the width thereof is about 0.4 µm) of the patterned polysilicon layer in which the gate 14 is predetermined to be formed, and an N-type implantation process is performed on a region (the width thereof is about 0.25 µm) of the patterned polysilicon layer in which the gate extending portion 20 is predetermined to be formed. So far, the fabrication of the gate 14 and the gate extending portion 20 having opposite doping types and substantially in contact with each other is completed.

Figure 5:
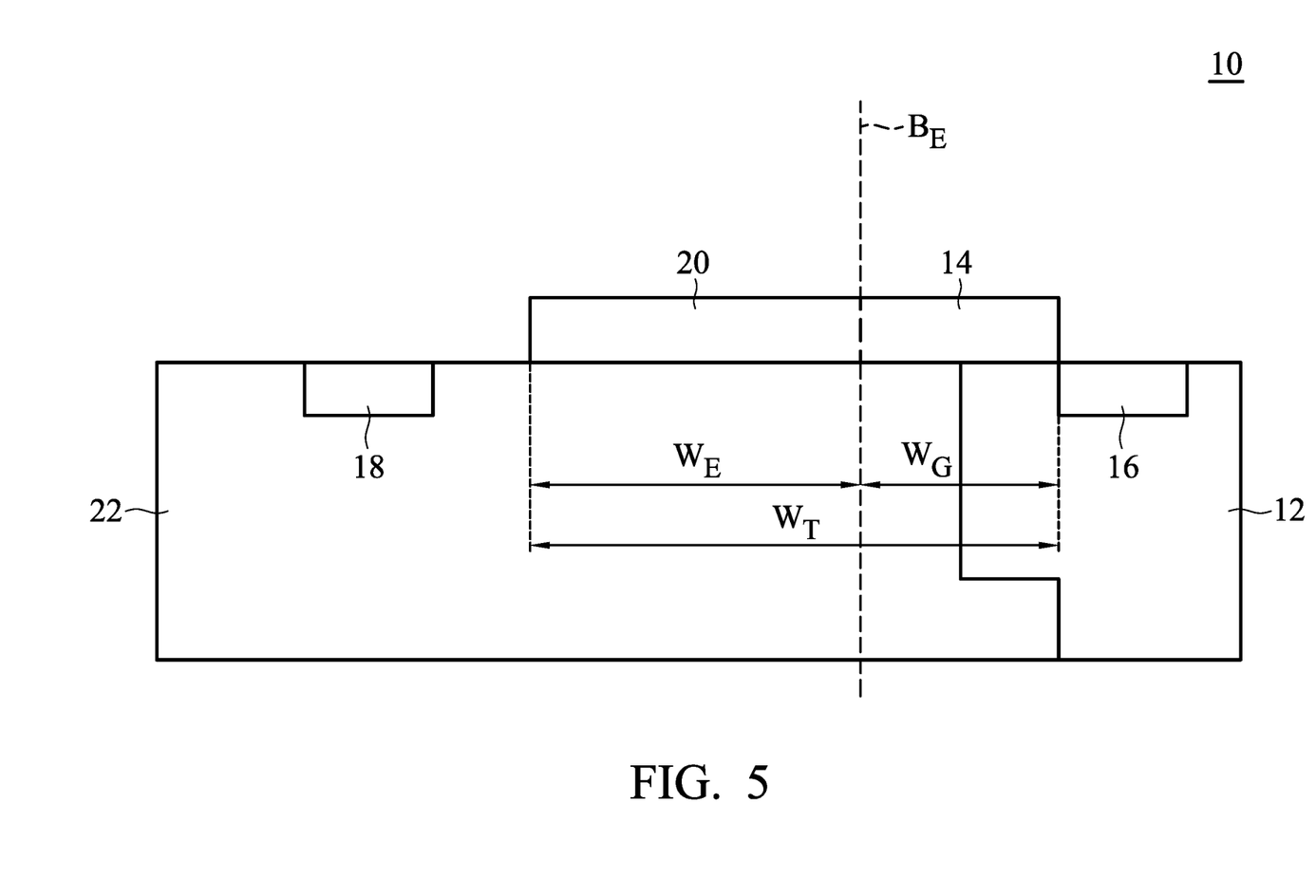
FIG. 5 is a cross-sectional view of a semiconductor structure in accordance with one embodiment of the invention.

Referring to FIG. 5, in accordance with one embodiment of the invention, a semiconductor structure 10 is provided. FIG. 5 is a cross-sectional view of the semiconductor structure 10.

As shown in FIG. 5, the semiconductor structure 10 includes a substrate 12, a gate 14, a source 16, a drain 18, a gate extending portion 20 and a drain drift region 22. The gate 14 is disposed on the substrate 12. The source 16 is disposed in the substrate 12 and located on one side of the gate 14. The drain 18 is disposed in the substrate 12 and located on another side of the gate 14. The gate extending portion 20 is disposed on the substrate 12 and located between the gate 14 and the drain 18. The drain drift region 22 is formed in the substrate 12 and surrounds the drain 18. Specifically, the doping type of the gate 14 is the opposite of that of the gate extending portion 20. For example, when the doping type of the gate 14 is N type, the doping type of the gate extending portion 20 is P type, or when the doping type of the gate 14 is P type, the doping type of the gate extending portion 20 is N type. Since the doping type of the gate 14 is the opposite of the doping type of the gate extending portion 20, a depletion region (not shown) is naturally formed between the gate 14 and the gate extending portion 20.

In some embodiments, the substrate 12 is a P-type semiconductor substrate or an N-type semiconductor substrate. In some embodiments, when the substrate 12 is a P-type semiconductor substrate, the doping type of the gate 14 is N type, the doping type of the source 16 is N type, the doping type of the drain 18 is N type, and the doping type of the gate extending portion 20 is P type. In some embodiments, when the substrate 12 is an N-type semiconductor substrate, the doping type of the gate 14 is P type, the doping type of the source 16 is P type, the doping type of the drain 18 is P type, and the doping type of the gate extending portion 20 is N type. In some embodiments, the gate 14 and the gate extending portion 20 include polysilicon doped with P-type dopants or polysilicon doped with N-type dopants.

In FIG. 5, the gate 14 is substantially in contact with the gate extending portion 20. For example, the gate 14 is substantially in contact laterally with the gate extending portion 20 (i.e. the sidewall of the gate 14 is substantially in contact with the sidewall of the gate extending portion 20). In the present embodiment, the ratio of the width "$W_E$" of the gate extending portion 20 (P-type doping) and the width "$W_G$" of the gate 14 (N-type doping) is about 1.17. In this situation, the width "$W_E$" of the gate extending portion 20 is about 0.35 µm, and the width "$W_G$" of the gate 14 is about 0.3 µm. In some embodiments, the ratio of the width "$W_E$" of the gate extending portion 20 and the width "$W_G$" of the gate 14 may also be other suitable ranges, and is not limited thereto. In some embodiments, the boundary "$B_E$" of the gate extending portion 20 and the gate 14 is not more than the range of the drain drift region 22 (i.e. the gate extending portion 20 only overlaps the drain drift region 22 in the substrate 12). In some embodiments, in the semiconductor structure 10, the sum "$W_T$" of the width "$W_E$" of the gate extending portion 20 and the width "$W_G$" of the gate 14 is a fixed value. In the present embodiment, when the ratio of the width "$W_E$" of the gate extending portion 20 and the width "$W_G$" of the gate 14 is about 1.17, the sum "$W_T$" of the width "$W_E$" of the gate extending portion 20 and the width "$W_G$" of the gate 14 is about 0.65 µm (that is, the width "$W_E$" of the gate extending portion 20 is about 0.35 µm, and the width "$W_G$" of the gate 14 is about 0.3 µm). In some embodiments, according to different product requirements, the sum "$W_T$" of the width "$W_E$" of the gate extending portion 20 and the width "$W_G$" of the gate 14 may also include other suitable sizes, and is not limited thereto. In the present embodiment, the gate extending portion 20 can be considered a metal field plate. The component operation is performed with the semiconductor structure of the present embodiment. Various operating conditions (for example, threshold voltage (Vth), linear-region drain current (Idlin), saturation-region drain current (Idsat), static breakdown voltage (BVoff)), and the drain-to-gate capacitance (Cgd) are shown in Table 1.

In some embodiments, the fabrication method of the gate 14 and the gate extending portion 20 which are substantially in contact with each other is shown. For example, first, a patterned polysilicon layer is formed on the substrate 12. Next, an N-type implantation process is performed on a region (the width thereof is about 0.3 µm) of the patterned polysilicon layer in which the gate 14 is predetermined to be formed, and a P-type implantation process is performed on a region (the width thereof is about 0.35 µm) of the patterned polysilicon layer in which the gate extending portion 20 is predetermined to be formed (as the present embodiment). Optionally, a P-type implantation process is performed on a region (the width thereof is about 0.3 µm) of the patterned polysilicon layer in which the gate 14 is predetermined to be formed, and an N-type implantation process is performed on a region (the width thereof is about 0.35 µm) of the patterned polysilicon layer in which the gate extending portion 20 is predetermined to be formed. So far, the fabrication of the gate 14 and the gate extending portion 20 having opposite doping types and substantially in contact with each other is completed.

TABLE 1

|  | No P-type doping on polysilicon | The semiconductor structure of FIG. 3 | The semiconductor structure of FIG. 4 | The semiconductor structure of FIG. 5 |
|---|---|---|---|---|
| The width of the gate extending portion (μm)/the width of the gate (μm) | X/0.5 | 0.15/0.5 | 0.25/0.4 | 0.35/0.3 |
| The drain-to-gate capacitance (Cgd)(F/μm) (Vds = 0 V) | 1.63e−15 | 8.11e−16 (−50.2%) | 3.55e−16 (−78.2%) | 3.10e−16 (−81.0%) |
| The drain-to-gate capacitance (Cgd)(F/μm) (Vds = 1.8 V) | 2.08e−16 | 1.82e−16 (−12.5%) | 1.76e−16 (−15.4%) | 1.74e−16 (−16.3%) |
| The sum of the width of the gate extending portion and the width of the gate (μm) | 0.65 | 0.65 | 0.65 | 0.65 |
| The threshold voltage (Vth)(V) | 0.880 | 0.880 | 0.880 | 0.879 |
| The linear-region drain current (Idlin)(μA) | 239 | 239 | 239 | 239 |
| The saturation-region drain current (Idsat)(mA) | 4.52 | 4.52 | 4.52 | 4.51 |
| The static breakdown voltage (BVoff)(V) | 33.1 | 33.1 | 33.1 | 33.1 |

As shown in Table 1, under the same operating conditions, as the ratio of the width of the gate extending portion and the width of the gate is gradually increased, the drain-to-gate capacitance is significantly reduced due to the effect of capacitor series connection. For example, when Vds=0V and the ratio of the width of the gate extending portion and the width of the gate is 0.3, the drain-to-gate capacitance of the semiconductor structure of the present invention is reduced by about 50.2% compared to that of the semiconductor structure in which the polysilicon is not P-doped. When the ratio of the width of the gate extending portion and the width of the gate is 0.625, the drain-to-gate capacitance of the semiconductor structure of the present invention is reduced by about 78.2% compared to that of the semiconductor structure in which the polysilicon is not P-doped. When the ratio of the width of the gate extending portion and the width of the gate is 1.17, the drain-to-gate capacitance of the semiconductor structure of the present invention is reduced by about 81% compared to that of the semiconductor structure in which the polysilicon is not P-doped. When Vds=1.8V and the ratio of the width of the gate extending portion and the width of the gate is 0.3, the drain-to-gate capacitance of the semiconductor structure of the present invention is reduced by about 12.5% compared to that of the semiconductor structure in which the polysilicon is not P-doped. When the ratio of the width of the gate extending portion and the width of the gate is 0.625, the drain-to-gate capacitance of the semiconductor structure of the present invention is reduced by about 15.4% compared to that of the semiconductor structure in which the polysilicon is not P-doped. When the ratio of the width of the gate extending portion and the width of the gate is 1.17, the drain-to-gate capacitance of the semiconductor structure of the present invention is reduced by about 16.3% compared to that of the semiconductor structure in which the polysilicon is not P-doped.

Figure 6:
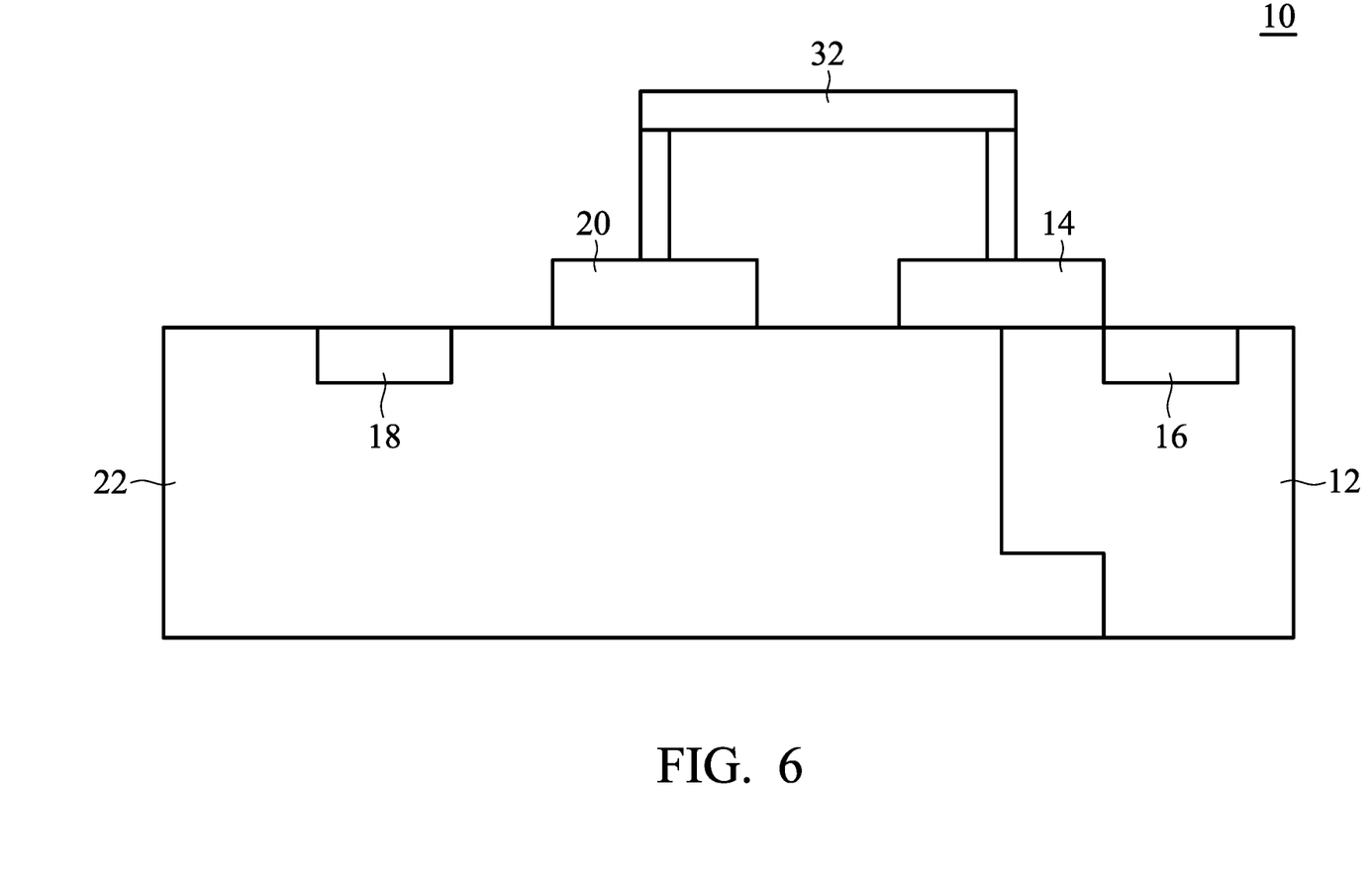
FIG. 6 is a cross-sectional view of a semiconductor structure in accordance with one embodiment of the invention.

Referring to FIG. 6, in accordance with one embodiment of the invention, a semiconductor structure 10 is provided. FIG. 6 is a cross-sectional view of the semiconductor structure 10.

As shown in FIG. 6, the semiconductor structure 10 includes a substrate 12, a gate 14, a source 16, a drain 18, a gate extending portion 20 and a drain drift region 22. The gate 14 is disposed on the substrate 12. The source 16 is disposed in the substrate 12 and located on one side of the gate 14. The drain 18 is disposed in the substrate 12 and located on another side of the gate 14. The gate extending portion 20 is disposed on the substrate 12 and located between the gate 14 and the drain 18. The drain drift region 22 is formed in the substrate 12 and surrounds the drain 18. Specifically, the doping type of the gate 14 is the opposite of that of the gate extending portion 20. For example, when the doping type of the gate 14 is N type, the doping type of the gate extending portion 20 is P type, or when the doping type of the gate 14 is P type, the doping type of the gate extending portion 20 is N type.

In some embodiments, the substrate 12 is a P-type semiconductor substrate or an N-type semiconductor substrate. In some embodiments, when the substrate 12 is a P-type semiconductor substrate, the doping type of the gate 14 is N type, the doping type of the source 16 is N type, the doping type of the drain 18 is N type, and the doping type of the gate extending portion 20 is P type. In some embodiments, when the substrate 12 is an N-type semiconductor substrate, the doping type of the gate 14 is P type, the doping type of the source 16 is P type, the doping type of the drain 18 is P type, and the doping type of the gate extending portion 20 is N type. In some embodiments, the gate 14 and the gate extending portion 20 include polysilicon doped with P-type dopants or polysilicon doped with N-type dopants.

In FIG. 6, the gate 14 is substantially separated from the gate extending portion 20. For example, the gate 14 is substantially separated laterally from the gate extending portion 20 (i.e. the sidewall of the gate 14 is substantially separated from the sidewall of the gate extending portion 20).

In FIG. 6, the gate extending portion 20 is electrically connected with the gate 14 by the metal layer 32. In the present embodiment, the gate extending portion 20 can be considered a metal field plate. In some embodiments, the fabrication method of the gate 14 and the gate extending portion 20 which are substantially separated from each other is shown. For example, first, a patterned polysilicon layer including two separated portions is formed on the substrate 12. Next, an N-type implantation process is performed on the separated portion of the patterned polysilicon layer in which the gate 14 is predetermined to be formed, and a P-type implantation process is performed on the separated portion of the patterned polysilicon layer in which the gate extending portion 20 is predetermined to be formed. Optionally, a P-type implantation process is performed on the separated portion of the patterned polysilicon layer in which the gate 14 is predetermined to be formed, and an N-type implantation process is performed on the separated portion of the patterned polysilicon layer in which the gate extending portion 20 is predetermined to be formed. So far, the fabrication of the gate 14 and the gate extending portion 20 having opposite doping types and substantially separated from each other is completed.

Figure 7:
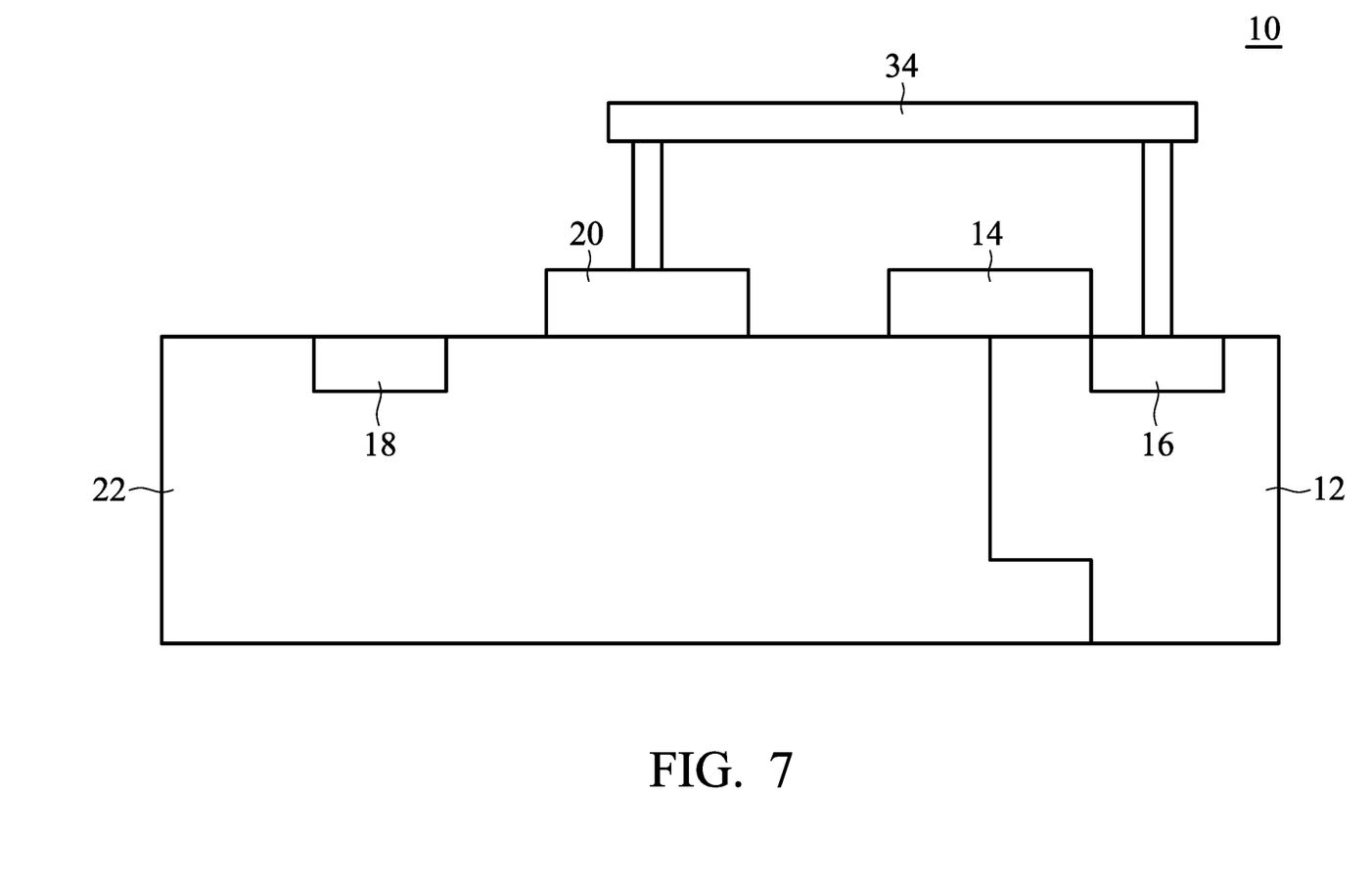
FIG. 7 is a cross-sectional view of a semiconductor structure in accordance with one embodiment of the invention.

Referring to FIG. 7, in accordance with one embodiment of the invention, a semiconductor structure 10 is provided. FIG. 7 is a cross-sectional view of the semiconductor structure 10.

As shown in FIG. 7, the semiconductor structure 10 includes a substrate 12, a gate 14, a source 16, a drain 18, a gate extending portion 20 and a drain drift region 22. The gate 14 is disposed on the substrate 12. The source 16 is disposed in the substrate 12 and located on one side of the gate 14. The drain 18 is disposed in the substrate 12 and located on another side of the gate 14. The gate extending portion 20 is disposed on the substrate 12 and located between the gate 14 and the drain 18. The drain drift region 22 is formed in the substrate 12 and surrounds the drain 18. Specifically, the doping type of the gate 14 is the opposite of that of the gate extending portion 20. For example, when the doping type of the gate 14 is N type, the doping type of the gate extending portion 20 is P type, or when the doping type of the gate 14 is P type, the doping type of the gate extending portion 20 is N type.

In some embodiments, the substrate 12 is a P-type semiconductor substrate or an N-type semiconductor substrate. In some embodiments, when the substrate 12 is a P-type semiconductor substrate, the doping type of the gate 14 is N type, the doping type of the source 16 is N type, the doping type of the drain 18 is N type, and the doping type of the gate extending portion 20 is P type. In some embodiments, when the substrate 12 is an N-type semiconductor substrate, the doping type of the gate 14 is P type, the doping type of the source 16 is P type, the doping type of the drain 18 is P type, and the doping type of the gate extending portion 20 is N type. In some embodiments, the gate 14 and the gate extending portion 20 include polysilicon doped with P-type dopants or polysilicon doped with N-type dopants.

In FIG. 7, the gate 14 is substantially separated from the gate extending portion 20. For example, the gate 14 is substantially separated laterally from the gate extending portion 20 (i.e. the sidewall of the gate 14 is substantially separated from the sidewall of the gate extending portion 20).

In FIG. 7, the gate extending portion 20 is electrically connected with the source 16 by the metal layer 34. In the present embodiment, the gate extending portion 20 can be considered a metal field plate. In some embodiments, the fabrication method of the gate 14 and the gate extending portion 20 which are substantially separated from each other is shown. For example, first, a patterned polysilicon layer including two separated portions is formed on the substrate 12. Next, an N-type implantation process is performed on the separated portion of the patterned polysilicon layer in which the gate 14 is predetermined to be formed, and a P-type implantation process is performed on the separated portion of the patterned polysilicon layer in which the gate extending portion 20 is predetermined to be formed. Optionally, a P-type implantation process is performed on the separated portion of the patterned polysilicon layer in which the gate 14 is predetermined to be formed, and an N-type implantation process is performed on the separated portion of the patterned polysilicon layer in which the gate extending portion 20 is predetermined to be formed. So far, the fabrication of the gate 14 and the gate extending portion 20 having opposite doping types and substantially separated from each other is completed.

In the present invention, two regions with opposite doping types (for example, the region adjacent to the drain is P-type doped (defined as the gate extending portion), and the region away from the drain is N-type doped (defined as the gate)) are formed in the polysilicon gate of a MOS transistor using implantation processes. Due to the effect of capacitor series connection, the drain-to-gate capacitance is reduced. As the ratio of the width of the gate extending portion and the width of the gate increases, the drain-to-gate capacitance decreases more obviously. At this time, the gate extending portion has the function of field plate, which can effectively disperse the electric field strength of the drain region (the drift region) and prevent the component from being damaged in a high-voltage operation environment. In addition, the two regions having opposite doping types can be fabricated into two separated structures. On the one hand, the gate extending portion can have the function of field plate, and on the other hand, the effect of reducing the drain-to-gate capacitance can be achieved. The cost of the present invention is low, and it is easily fabricated without changing the existing MOS process specifications. Due to the drop in the drain-to-gate capacitance, undesired current flow caused by the coupling effect of the transistor is avoided. The specific semiconductor structure design of the present invention can effectively reduce the power loss of the switching components, greatly improving the switching frequency and achieving high-efficiency electric power conversion.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a substrate;
a gate disposed on the substrate;
a source disposed in the substrate and located on one side of the gate;
a drain disposed in the substrate and located on another side of the gate;
a gate extending portion disposed on the substrate and located between the gate and the drain, wherein the gate has a doping type which is opposite that of the gate extending portion, and the gate is in contact with the gate extending portion; and
a metal field plate disposed on the substrate and located between the gate extending portion and the drain.

2. The semiconductor structure as claimed in claim 1, wherein the substrate is a P-type substrate or an N-type substrate.

3. The semiconductor structure as claimed in claim 2, wherein when the substrate is a P-type substrate, the doping type of the gate is N type, the source has a doping type of N type, the drain has a doping type of N type, and the doping type of the gate extending portion is P type.

4. The semiconductor structure as claimed in claim 2, wherein when the substrate is an N-type substrate, the doping type of the gate is P type, the source has a doping type of P type, the drain has a doping type of P type, and the doping type of the gate extending portion is N type.

5. The semiconductor structure as claimed in claim 1, further comprising an oxide layer disposed on the substrate and underneath the metal field plate.

6. The semiconductor structure as claimed in claim 1, wherein the metal field plate is electrically connected with the gate and the gate extending portion.

7. The semiconductor structure as claimed in claim 1, wherein the metal field plate is electrically connected with the source.

8. The semiconductor structure as claimed in claim 1, wherein the gate extending portion and the gate have a width ratio which is in a range from 0.3 to 1.2.

9. The semiconductor structure as claimed in claim 1, wherein the gate and the gate extending portion comprise polysilicon.

10. A semiconductor structure, comprising:
- a substrate;
- a gate disposed on the substrate;
- a source disposed in the substrate and located on one side of the gate;
- a drain disposed in the substrate and located on another side of the gate; and
- a gate extending portion disposed on the substrate and located between the gate and the drain, wherein the gate has a doping type which is opposite that of the gate extending portion;
- wherein the gate is separated from the gate extending portion;
- wherein the gate is electrically connected with the gate extending portion.

\* \* \* \* \*